(12) United States Patent
Lee et al.

(10) Patent No.: US 10,797,143 B2
(45) Date of Patent: Oct. 6, 2020

(54) SEMICONDUCTOR DEVICES AND METHOD OF FORMING THE SAME

(71) Applicant: Samsung Electronics Co., Ltd., Suwon-si, Gyeonggi-do (KR)

(72) Inventors: Keun Lee, Cheongju-si (KR); Jeong Gil Lee, Hwaseong-si (KR); Do Hyung Kim, Seongnam-si (KR); Ki Hyun Yoon, Hwaseong-si (KR); Hyun Seok Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/914,113

(22) Filed: Mar. 7, 2018

(65) Prior Publication Data

US 2019/0067429 A1 Feb. 28, 2019

(30) Foreign Application Priority Data

Aug. 31, 2017 (KR) ........................ 10-2017-0111188

(51) Int. Cl.
| | |
|---|---|
| *H01L 29/423* | (2006.01) |
| *H01L 27/1157* | (2017.01) |
| *H01L 27/11582* | (2017.01) |
| *H01L 29/49* | (2006.01) |
| *H01L 21/28* | (2006.01) |
| *G11C 16/08* | (2006.01) |
| *G11C 16/04* | (2006.01) |

(52) U.S. Cl.
CPC .... *H01L 29/4234* (2013.01); *H01L 21/28079* (2013.01); *H01L 27/1157* (2013.01); *H01L 27/11582* (2013.01); *H01L 29/40117* (2019.08); *H01L 29/495* (2013.01); *G11C 16/0483* (2013.01); *G11C 16/08* (2013.01)

(58) Field of Classification Search
None
See application file for complete search history.

(56) References Cited

U.S. PATENT DOCUMENTS

| | | | |
|---|---|---|---|
| 5,956,609 | A | 9/1999 | Lee et al. |
| 6,030,893 | A | 2/2000 | Lo et al. |
| 6,593,233 | B1 | 7/2003 | Miyazaki et al. |
| 7,276,443 | B2 | 10/2007 | Kim et al. |
| 8,623,733 | B2 | 1/2014 | Chen et al. |

(Continued)

FOREIGN PATENT DOCUMENTS

KR 100321141 B1 5/2002

*Primary Examiner* — Zandra V Smith
*Assistant Examiner* — Lawrence C Tynes, Jr.
(74) *Attorney, Agent, or Firm* — Myers Bigel, P.A.

(57) ABSTRACT

Semiconductor devices and methods of forming the same are provided. Semiconductor devices may include a plurality of gate electrodes that are stacked on a substrate and are spaced apart from each other in a vertical direction and a channel region extending through the plurality of gate electrodes in the vertical direction. Each of the plurality of gate electrodes may include a first conductive layer defining a recess recessed toward the channel region, and a second conductive layer in the recess defined by the first conductive layer. A first concentration of impurities in the second conductive layer may be higher than a second concentration of the impurities in the first conductive layer, and the impurities may include nitrogen (N).

15 Claims, 16 Drawing Sheets

(56) References Cited

U.S. PATENT DOCUMENTS

| | | | |
|---|---|---|---|
| 9,748,174 B1* | 8/2017 | Amano | H01L 27/11582 |
| 2007/0080393 A1* | 4/2007 | Togo | H01L 21/2658 |
| | | | 257/315 |
| 2007/0139861 A1* | 6/2007 | Nakano | H01G 4/1227 |
| | | | 361/311 |
| 2009/0170315 A1 | 7/2009 | Seok | |
| 2009/0246373 A1 | 10/2009 | Tachibana et al. | |
| 2010/0105185 A1* | 4/2010 | Ku | H01L 29/1083 |
| | | | 438/301 |
| 2011/0215392 A1* | 9/2011 | Kim | H01L 23/535 |
| | | | 257/315 |
| 2014/0061773 A1* | 3/2014 | Higuchi | H01L 29/792 |
| | | | 257/326 |
| 2016/0343612 A1 | 11/2016 | Wang et al. | |
| 2017/0062472 A1 | 3/2017 | Park et al. | |
| 2017/0125538 A1 | 5/2017 | Sharangpani et al. | |
| 2017/0236779 A1* | 8/2017 | Komori | H01L 23/53266 |
| | | | 257/326 |
| 2018/0097009 A1* | 4/2018 | Zhang | H01L 27/11519 |
| 2018/0182771 A1* | 6/2018 | Costa | H01L 27/1157 |
| 2018/0261613 A1* | 9/2018 | Ariyoshi | H01L 27/11575 |

\* cited by examiner

SEMICONDUCTOR DEVICES AND METHOD OF FORMING THE SAME

CROSS-REFERENCE TO RELATED APPLICATION

This application claims priority under 35 U.S.C. § 119 to Korean Patent Application No. 10-2017-0111188, filed on Aug. 31, 2017, in the Korean Intellectual Property Office, the disclosure of which is hereby incorporated herein by reference in its entirety.

BACKGROUND

The present disclosure generally relates to the field of electronics and, more particularly, a semiconductor device.

Electronic products have gradually been reduced in size while simultaneously being required to be able to process large amounts of data. Accordingly, a degree of integration of semiconductor memory devices used in such electronic products has been increased. Memory devices having a vertical transistor structure, instead of a planar transistor structure, have been proposed to increase the degree of integration.

SUMMARY

Semiconductor devices according to some embodiments of the present inventive concept may have improved reliability.

According to some embodiments of the present inventive concept, semiconductor devices may include a plurality of gate electrodes that are stacked on a substrate and are spaced apart from each other in a vertical direction and a channel region extending through the plurality of gate electrodes in the vertical direction. Each of the plurality of gate electrodes may include a first conductive layer defining a recess recessed toward the channel region, and a second conductive layer in the recess defined by the first conductive layer. A first concentration of impurities in the second conductive layer may be higher than a second concentration of the impurities in the first conductive layer, and the impurities may include nitrogen (N).

According to some embodiments of the present inventive concept, semiconductor devices may include a plurality of gate electrodes that are stacked on a substrate and are spaced apart from each other in a vertical direction and a channel region extending through the plurality of gate electrodes in the vertical direction. Each of the plurality of gate electrodes may include a first conductive layer defining a recess recessed toward the channel region, and a second conductive layer in the recess defined by the first conductive layer. The second conductive layer may have a first concentration of impurities higher than a second concentration of the impurities in the first conductive layer and may have a first resistivity higher than a second resistivity of the first conductive layer.

According to some embodiments of the present inventive concept, semiconductor devices may include a plurality of gate electrodes that are stacked on a substrate and are spaced apart from each other in a vertical direction and a channel region extending through the plurality of gate electrodes in the vertical direction. Each of the plurality of gate electrodes may include a first metallic layer defining a recess recessed toward the channel region, and a second metallic layer in the recess defined by the first metallic layer. A first nitrogen concentration of the second metallic layer may be higher than a second nitrogen concentration of the first metallic layer.

According to some embodiments of the present inventive concept, methods of manufacturing a semiconductor device may include forming a stack including a plurality of sacrificial layers and a plurality of insulating layers stacked in an alternating sequence on a substrate, forming a channel extending through the plurality of sacrificial layers and the plurality of insulating layers, forming an isolation area extending through the stack, forming a plurality of openings by removing the plurality of sacrificial layers through the isolation area, and forming a first conductive layer in the plurality of openings. The first conductive layer may define a plurality of recesses in the plurality of openings, respectively. The methods may also include forming a second conductive layer on the first conductive layer in the plurality of openings. The second conductive layer may have a higher concentration of impurities than the first conductive layer and may have a higher resistivity than the first conductive layer.

BRIEF DESCRIPTION OF DRAWINGS

The above and other aspects, features, and advantages of the present inventive concept will be more clearly understood from the following detailed description taken in conjunction with the accompanying drawings. As used herein the term "and/or" includes any and all combinations of one or more of the associated listed items. Like reference numbers refer to like elements throughout.

DETAILED DESCRIPTION

Hereinafter, semiconductor devices according to example embodiments of the present inventive concept will be described with reference to the accompanying drawings.

Figure 1:
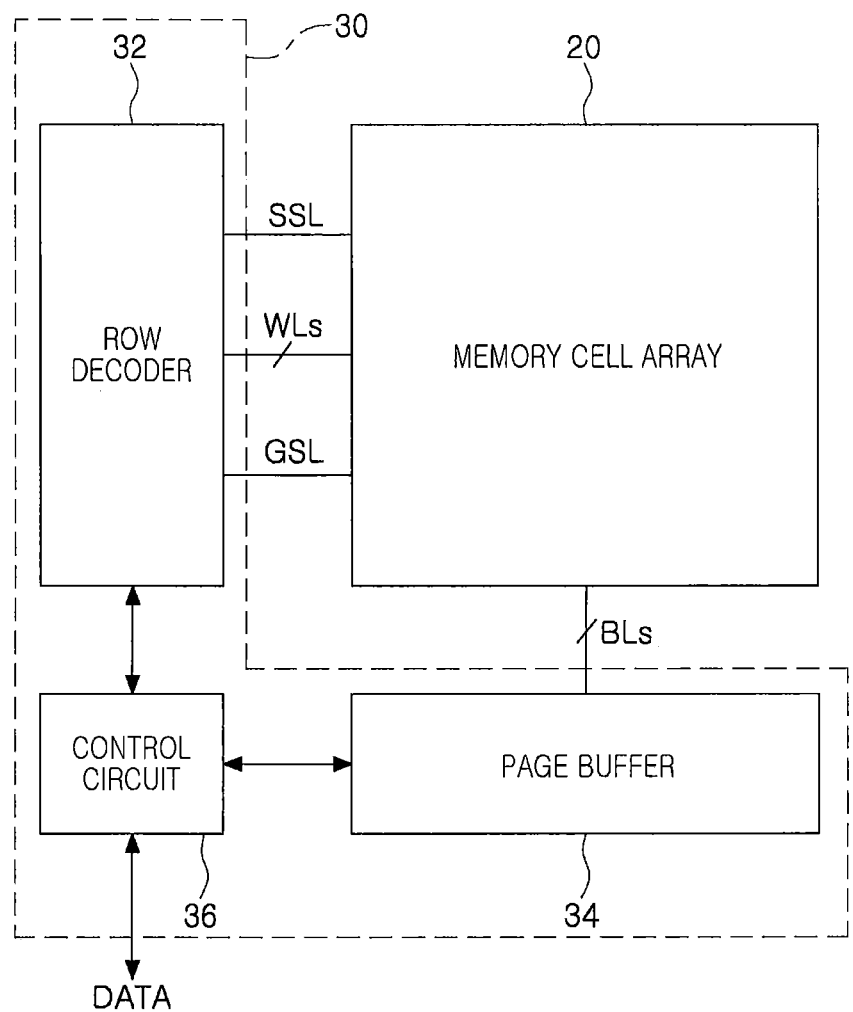
FIG. 1 is a schematic block diagram of a semiconductor device according to example embodiments of the present inventive concept.

FIG. 1 is a block diagram of a semiconductor device according to example embodiments of the present inventive concept. Referring to FIG. 1, a semiconductor device 10 may include a memory cell array 20 and a control logic 30.

The memory cell array 20 may include a plurality of memory blocks, and each of the memory blocks may include a plurality of memory cells. The plurality of memory cells may be connected to a row decoder 32 via a string select line SSL, a plurality of word lines WLs, and a ground select line GSL, as well as to a page buffer 34 via a plurality of bit lines BLs. In some example embodiments, the plurality of memory cells arranged in the same row may be connected to the same word line WL, and the plurality of memory cells arranged in the same column may be connected to the same bit line BL.

The control logic 30 may include the row decoder 32, the page buffer 34, and a control circuit 36.

The row decoder 32 may decode a received address and may generate and transmit driving signals of word lines WLs. The row decoder 32 may supply a word line voltage generated in a voltage generation circuit included in the control circuit 36 to a selected word line WL and unselected word lines WLs, in response to a signal provided by the control circuit 36.

The page buffer 34 may be connected to the memory cell array 20 via the bit lines BLs to read information stored in the memory cells. The page buffer 34 may temporarily store data to be stored to the memory cells or may sense the data stored in the memory cells, depending on an operation mode. The page buffer 34 may include a column decoder and a sensing amplifier. The column decoder may selectively activate the bit lines BLs of the memory cell array 20. The sensing amplifier may sense a voltage of a bit line BL selected by the column decoder to read data stored in a selected memory cell, during a reading operation.

The control circuit 36 may control operations of the row decoder 32 and the page buffer 34. The control circuit 36 may receive an external control signal and an external voltage and operate according to the received control signal. The control circuit 36 may include the voltage generation circuit generating voltages, such as a programming voltage, a reading voltage, and an erasing voltage, which may be necessary for an internal operation, using the external voltage. The control circuit 36 may control reading, writing, and/or erasing operations in response to the control signals. In addition, the control circuit 36 may include an input/output circuit. The input/output circuit may receive data DATA to be transmitted to the page buffer 34 during a programming operation and may output data DATA received from the page buffer 34 during a reading operation.

Figure 2:
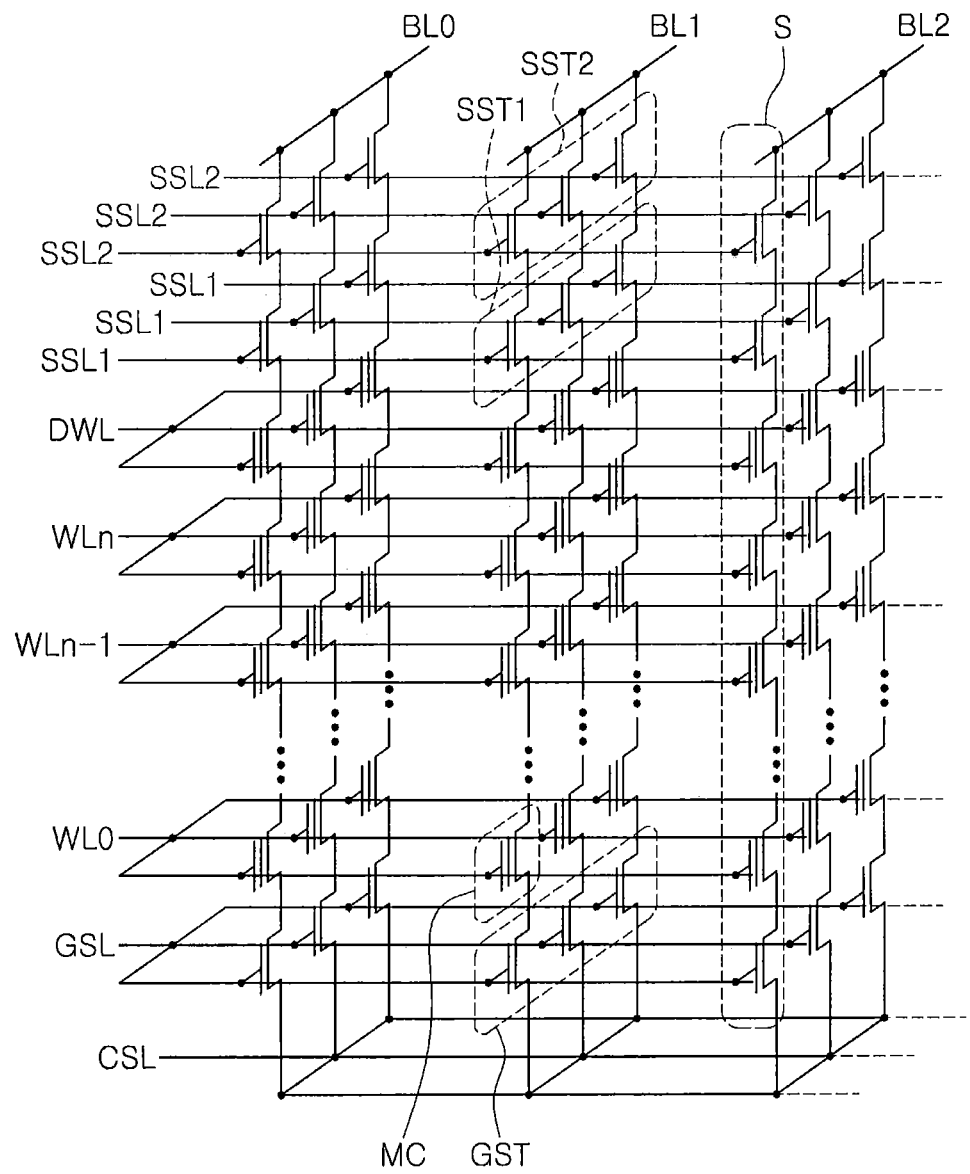
FIG. 2 is a circuit diagram of a memory cell array of a semiconductor device according to example embodiments of the present inventive concept.

FIG. 2 is a circuit diagram of a memory cell array of a semiconductor device according to example embodiments of the present inventive concept. FIG. 2 is a circuit diagram provided to describe the memory cell array 20 of FIG. 1.

Referring to FIG. 2, in some embodiments, a memory cell array 20a may include a plurality of memory cell strings S, each of which includes memory cells MC connected to each other in series, and a ground select transistor GST and string select transistors SST1 and SST2 respectively connected to both ends of the memory cells MC in series. Ones of the plurality of memory cell strings S may be connected to one of a plurality of bit lines BL0 to BL2 in parallel. The plurality of memory cell strings S may be commonly connected to a common source line CSL. That is, the plurality of memory cell strings S may be arranged between the plurality of bit lines BL0 to BL2 and the common source line CSL. In some example embodiments, two or more common source lines CSL may be arranged two-dimensionally.

The memory cells MC connected to each other in series may be controlled by word lines WL0 to WLn (e.g., WL0, ... WLn-1, and WLn) selecting the memory cells MC. Each of the memory cells MC may include a data storage element. Gate electrodes of the memory cells MC arranged at substantially the same distance from the common source line CSL may be commonly connected to one of the word lines WL0 to WLn, to be in an equipotential state. Alternatively, even when the gate electrodes of the memory cells MC are arranged at substantially the same distance from the common source line CSL, the gate electrodes arranged in different rows or columns may be independently controlled.

The ground select transistor GST may be controlled by a ground select line GSL and connected to the common source line CSL. The string select transistors SST1 and SST2 may be controlled by string select lines SSL1 and SSL2 and connected to the bit lines BL0 to BL2. Although the memory cells MC connected to each other in series are illustrated to be respectively connected to a single ground select transistor GST and two string select transistors SST1 and SST2 in FIG. 2, the present inventive concept is not limited thereto. The memory cells MC may be respectively connected to a single ground select transistor GST and a single string select transistor SST1 or SST2, or to a plurality of ground select transistors GST. One or more dummy lines DWLs or buffer lines may be further disposed between the uppermost word line WLn of the word lines WL0 to WLn and the string select lines SSL1 and SSL2. In some example embodiments, one or more dummy lines DWLs may be also disposed between the lowermost word line WL0 and the ground select line GSL.

When a signal is applied to the string select transistors SST1 and SST2 via the string select lines SSL1 and SSL2, data reading and writing operations may be performed by transmitting a signal applied via the bit lines BL0, BL1, and BL2 to the memory cells MC connected to each other in series. In addition, an erasing operation for erasing data stored in the memory cells MC may be performed by applying a predetermined erasing voltage via a substrate. In some example embodiments, the memory cell array 20a may further include at least one dummy memory cell string electrically isolated from the bit lines BL0 to BL2.

Figure 3:
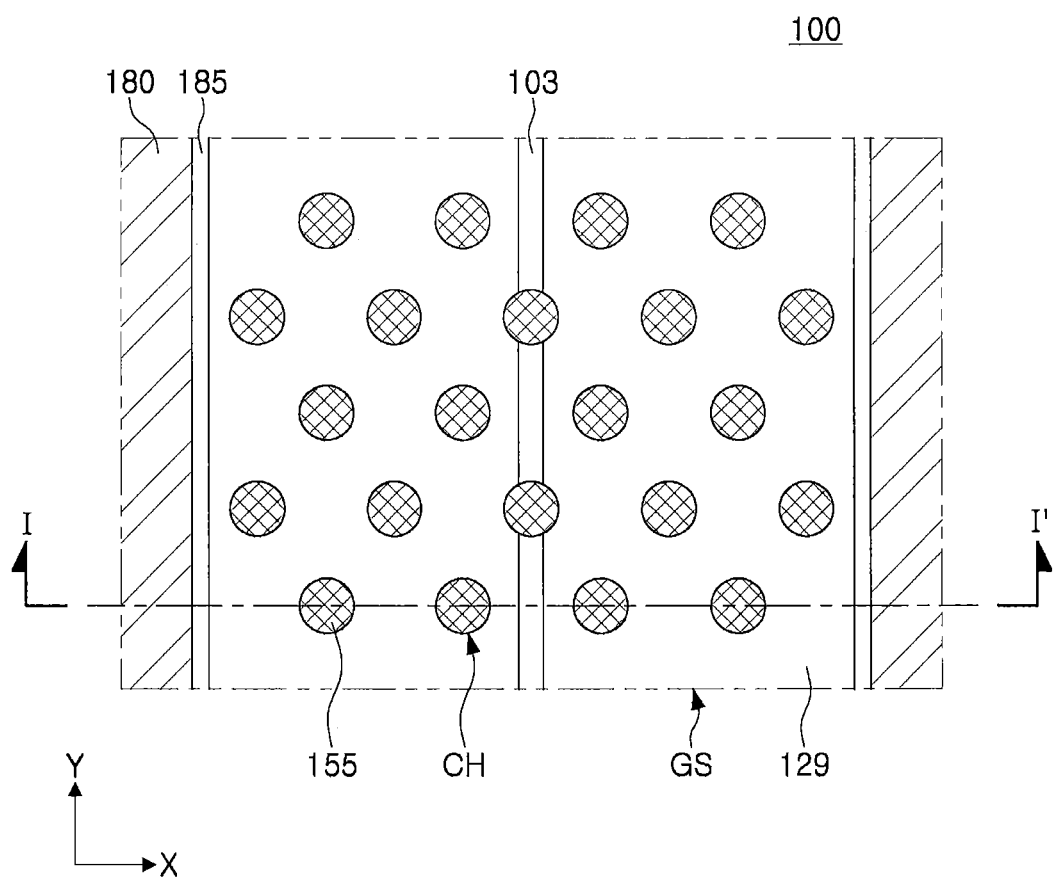
FIGS. 3 and 4 are a plan view and a cross-sectional view of a semiconductor device according to example embodiments of the present inventive concept, respectively.
Figure 4:
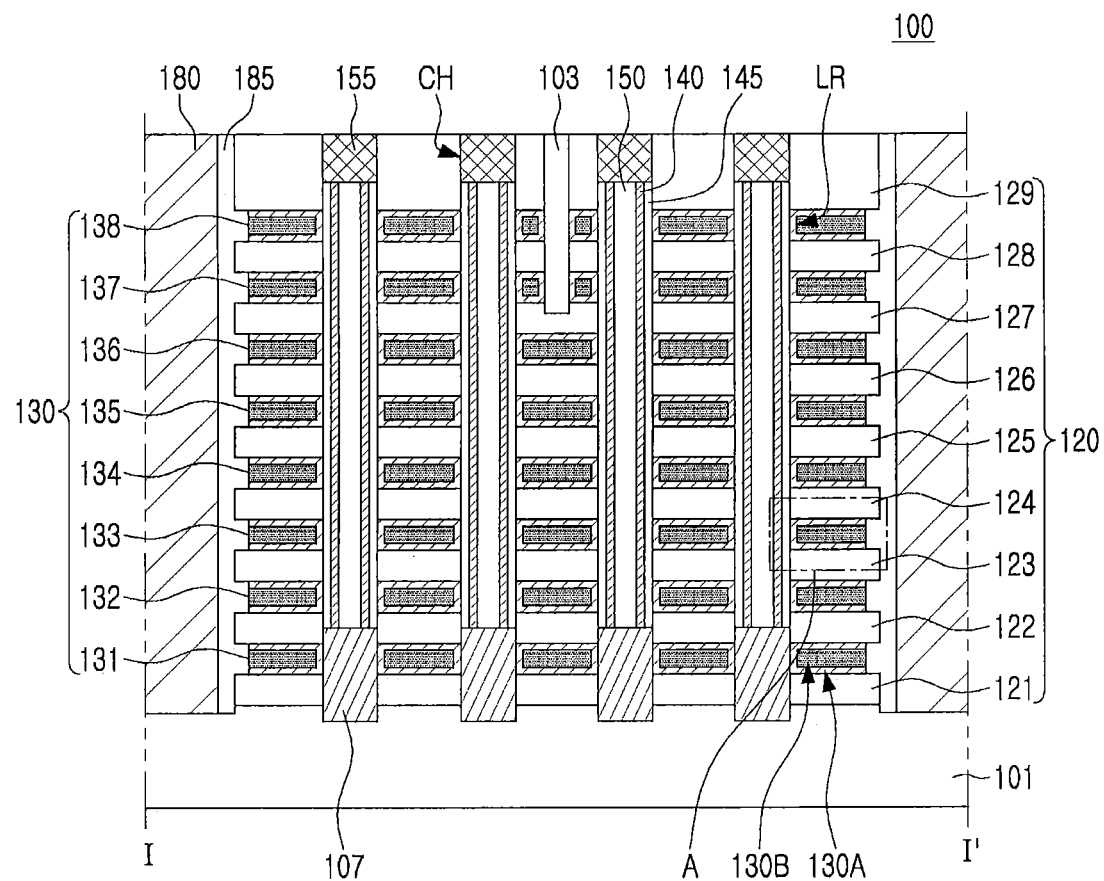

FIGS. 3 and 4 are a plan view and a cross-sectional view of a semiconductor device according to example embodiments of the present inventive concept, respectively. FIG. 4 is a cross-sectional view taken along the line I-I' of FIG. 3.

Referring to FIGS. 3 and 4, a semiconductor device 100 may include a substrate 101, channels CH extending in a direction (e.g., a vertical direction) perpendicular to an upper surface of the substrate 101 and having channel regions 140 therein, and a gate stack GS including plurality of interlayer insulating layers 120 and a plurality of gate electrodes 130 including at least two conductive layers 130A and 130B. The semiconductor device 100 may further include gate dielectric layers 145 interposed between the channel regions 140 and the gate electrodes 130, epitaxial layers 107 disposed below the channel regions 140, channel pads 155 disposed at upper ends of the channels CH, and source conductive layers 180 disposed between the gate electrodes 130.

In the semiconductor device 100, a single memory cell string may be formed around each channel region 140, and a plurality of memory cell strings may be arranged in rows and columns in an X-direction and a Y-direction.

The substrate 101 may have the upper surface extending in the X-direction and the Y-direction. The substrate 101 may include a semiconductor material, such as a Group IV semiconductor material, a Group III-V compound semiconductor material, or a Group II-VI oxide semiconductor material. For example, the Group IV semiconductor material may include silicon, germanium, or silicon-germanium. The substrate 101 may be provided in a form of a bulk wafer, an epitaxial layer, a silicon-on-insulator (SOI) layer, or a semiconductor-on-insulator (SeOI) layer.

In some embodiments, the channels CH may be arranged to be spaced apart from each other in rows and columns on the substrate 101, as illustrated in FIG. 3. The channels CH may be arranged to form a lattice pattern or a zigzag pattern in a certain direction. Each of the channels CH may have a side surface perpendicular to the substrate 101. In some embodiments, each of the channels CH may have an inclined side surface such that a width thereof decreases toward the substrate 101 depending on an aspect ratio thereof. The channel regions 140 may be disposed in channels CH. The channel regions 140 may have an annular shape, surrounding channel insulating layers 150 disposed in the channels CH. In some example embodiments, the channel regions 140 may have a pillar shape, such as a cylindrical shape or a prismatic shape, without channel insulating layers 150. The channel regions 140 may be connected to the epitaxial layers 107 therebelow. The channel regions 140 may include a semiconductor material, such as polysilicon or single crystalline silicon, and the semiconductor material may be an undoped material or a material including p-type or n-type impurities. The channels CH arranged in a straight line extending in the X-direction may be respectively connected to different bit lines, according to the arrangement of upper interconnection structures connected to the channel pads 155. Some of the channels CH may be dummy channels and thus may not be connected to the bit lines.

The plurality of gate electrodes 130 including gate electrodes 131 to 138 (i.e., 131, 132, 133, 134, 135, 136, 137, and 138) may be arranged on the side surface of each of the channels CH and may be spaced apart from each other in a direction perpendicular to the substrate 101 (e.g., Z-direction). The gate electrodes 130 may form a gate stack GS with the interlayer insulating layers 120. The gate electrodes 130 may respectively configure gate electrodes of the ground select transistor GST, the plurality of memory cells MC, and the string select transistors SST1 and SST2 illustrated in FIG. 2. The gate electrodes 130 may be the word lines WL0 to WLn, the string select lines SSL1 and SSL2, and the ground select line GSL, and the word lines WL0 to WLn may be commonly connected in a predetermined unit of adjacent memory cell strings S arranged in the X-direction and the Y-direction. The gate electrodes 130 corresponding to the string select lines SSL1 and SSL2 may be isolated from each other in the X-direction by a string insulating layer 103. However, the number of gate electrodes 130 isolated by the string insulating layer 103 is not limited to that illustrated in the drawings.

In some example embodiments, the gate electrodes 130 of the string select transistors SST1 and SST2 and the ground select transistor GST may be one or more and may have the same structure as or a different structure from the gate electrodes 130 of the memory cells MC. In some embodiments, some of the gate electrodes 130, such as the gate electrodes 130 adjacent to the gate electrodes 130 of the ground select transistor GST or the string select transistors SST1 and SST2, may be dummy gate electrodes.

The gate electrodes 130 may include a metal, such as tungsten (W), cobalt (Co), molybdenum (Mo), ruthenium (Ru), or nickel (Ni). In some example embodiments, the gate electrodes 130 may include polysilicon or a metal silicide material. In some example embodiments, the gate electrodes 130 may further include a diffusion barrier layer. The gate electrodes 130 may include the first and second conductive layers 130A and 130B. The first and second conductive layers 130A and 130B may be formed by different processes. The first and second conductive layers 130A and 130B may include different metallic materials and/or have different physical properties from each other. In some embodiments, the first and second conductive layers 130A and 130B may include the same metallic material (e.g., tungsten (W), cobalt (Co), molybdenum (Mo), ruthenium (Ru), and nickel (Ni)).

Referring to FIG. 4, the first conductive layer 130A may be disposed to be adjacent to the channels CH or the channel regions 140 and may define laterally recessed portions (e.g., recesses) LR recessed toward the channel regions 140 and between a pair of the interlayer insulating layers 120 adjacent each other in the Z-direction (i.e., a vertical direction). Accordingly, the first conductive layer 130A may extend toward the channels CH or the channel regions 140 on a lower surface of a first one of the pair of the interlayer insulating layers 120 disposed on an upper side of the first conductive layers 130A, may extend vertically on the channels CH or the channel regions 140, and may extend on an upper surface of a second one of the pair of the interlayer insulating layers 120 disposed on a lower side of the first conductive layers 130A. The first conductive layer 130A may include a single laterally recessed portion LR between the source conductive layer 180 and the channels CH adjacent to the source conductive layer 180 in the X-direction, and two laterally recessed portions LR at both ends thereof between the channels CH adjacent to each other. The second conductive layer 130B may be disposed in the laterally recessed portion LR to fill spaces between the pair of the interlayer insulating layers 120 adjacent to each other in the vertical direction. The first and second conductive layers 130A and 130B may be arranged in such a manner that side surfaces thereof are coplanar at a portion adjacent to the source conductive layer 180, but the present inventive concept is not limited thereto.

In some embodiments, in a single gate electrode 130, a volume of the first conductive layer 130A may be smaller than a volume of the second conductive layer 130B. However, the volume ratio of the first and second conductive layers 130A and 130B is not limited thereto and may be determined by considering a thickness and resistance of the gate electrodes 130, a stress inducing strain, such as warpage of the substrate 101, or the like.

The second conductive layer 130B may include a higher concentration of impurities than the first conductive layer 130A. The impurities are non-metallic elements. For example, the impurities may include at least one of nitrogen (N), fluorine (F), chlorine (Cl), and carbon (C). A nitrogen concentration of the second conductive layer 130B may be higher than a nitrogen concentration of the first conductive layer 130A. In addition, the second conductive layer 130B may include at least one of F, Cl, and C and a concentration of the at least one of F, Cl, and C may be higher than that of the first conductive layer 130A. The least one of F, Cl, and C may be elements of a source gas used to form the second conductive layer 130B. The second conductive layer 130B may be formed to have a superior morphology to the first conductive layer 130A by including the impurities during a manufacturing process thereof.

For example, the second conductive layer 130B may include at least one of F, Cl, and C at a first concentration in a range of about $5 \times 10^{19}/cm^3$ to about $5 \times 10^{21}/cm^3$ and may include N at a second concentration in a range of about $5\times10^{18}$/cm$^3$ to about $5\times10^{20}$/cm$^3$, which is lower than the first concentration. The first conductive layer 130A may include the impurities, too. For example, the first conductive layer 130A may include at least one of F, Cl, and C. The total impurity concentration of the first conductive layer 130A may be less than 5% of the total impurity concentration of the second conductive layer 130B. In some example embodiments, the first conductive layer 130A may include at least one of F, Cl, and C at the same concentration as the second conductive layer 130B and may be substantially devoid of N. That is, the first conductive layer 130A may not include intentionally added or injected N, while including a small amount of N diffused from the second conductive layer 130B.

The first conductive layer 130A may have a lower resistivity than the second conductive layer 130B. One of the reasons for this may be that the concentration of the impurities in the first conductive layer 130A is lower than that in the second conductive layer 130B. The first conductive layer 130A may be a layer having a lower stress than the second conductive layer 130B. The average grain size of a material forming the first conductive layer 130A may be smaller than that of a material forming the second conductive layer 130B.

The plurality of interlayer insulating layers 120 including 121 to 129 (i.e., 121, 122, 123, 124, 125, 126, 127, 128, and 129) may be interposed between the gate electrodes 130. The interlayer insulating layers 120, like the gate electrodes 130, may be arranged to be spaced apart in a Z-direction (i.e., a vertical direction) and to extend in the Y-direction. The interlayer insulating layers 120 may include an insulating material, such as silicon oxide (SiO$_2$) or silicon nitride (Si$_3$N$_4$).

Side surfaces of the interlayer insulating layers 120 may have a structure protruding from side surfaces of the gate electrodes 130 toward a source insulating layer 185. In some example embodiments, the side surfaces of the interlayer insulating layers 120 may be coplanar with the side surfaces of the gate electrodes 130.

The gate dielectric layers 145 may be interposed between the gate electrodes 130 and the channel regions 140. The gate dielectric layers 145 may extend on the channels CH to be perpendicular to the upper surface of the substrate 101. Each of the gate dielectric layers 145 may include a tunneling layer, a charge storage layer, and a blocking layer, sequentially stacked on one of the channel regions 140. These will be described later with reference to FIG. 5, in detail.

Referring to FIG. 4, the epitaxial layer 107 may be disposed at lower ends of the channel CH on the substrate 101. The epitaxial layer 107 may be disposed on a side surface of at least one gate electrode 130. The epitaxial layer 107 may be disposed on a recessed area of the substrate 101. An upper surface of the epitaxial layer 107 may be higher than an upper surface of the lowest gate electrode 131 and lower than a lower surface of the second lowest gate electrode 132 disposed on the lowest gate electrode 131, but the present inventive concept is not limited to that illustrated in FIG. 4. Due to the epitaxial layer 107, even when an aspect ratio of the channel CH increases, the channel region 140 may be electrically stably connected to the substrate 101, and characteristics of the ground select transistors GST between the memory cell strings may be uniform. However, in some example embodiments, the epitaxial layer 107 may be omitted. In this case, the channel region 140 may be directly connected to the substrate 101.

The channel pads 155 may be disposed on the channel regions 140 in the channels CH. The channel pads 155 may be disposed to cover upper surfaces of the channel insulating layers 150 and to be electrically connected to the channel regions 140. The channel pads 155 may include, for example, doped polysilicon.

The source conductive layer 180 may pass through the gate electrodes 130 and the interlayer insulating layers 120 between the channel regions 140, to be connected to the substrate 101. The source conductive layer 180 may be electrically isolated from the gate electrodes 130 by the source insulating layer 185. Accordingly, the gate electrodes 130 may be separated from each other in the X-direction, with the source conductive layer 180 therebetween. The source conductive layer 180 may have a line shape extending in the Y-direction and may correspond to the common source line CSL described with reference to FIGS. 1 and 2. The source conductive layers 180 may be arranged at predetermined intervals in the X-direction. For example, one source conductive layer 180 may be arranged for every four to five columns of the channel regions 140, but the present inventive concept is not limited thereto. Although the source conductive layer 180 is illustrated as having a side surface perpendicular to the upper surface of the substrate 101 in the drawings, the source conductive layer 180 may have a shape in which a width thereof decreases toward the substrate 101 due to a high aspect ratio.

Figure 5:
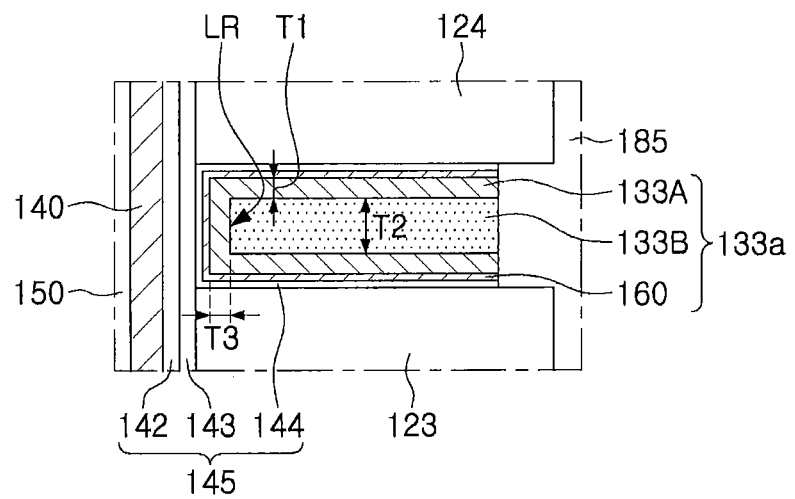
FIGS. 5 to 7 are cross-sectional views of portions of a semiconductor device according to example embodiments of the present inventive concept.
Figure 6:
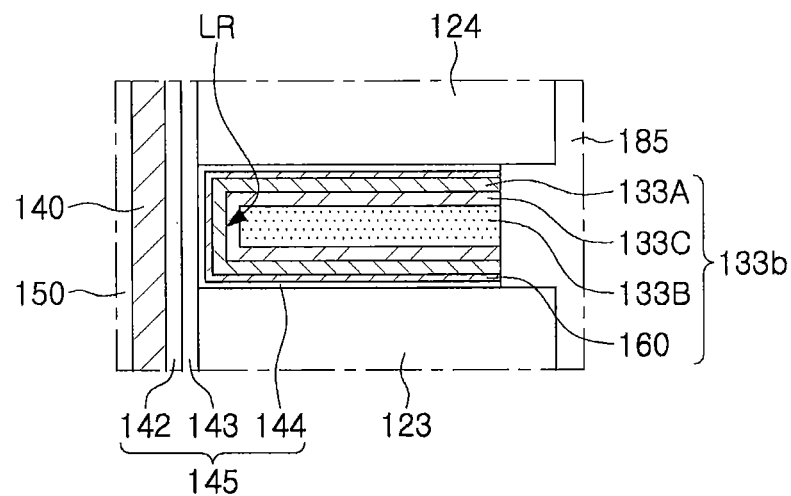
Figure 7:
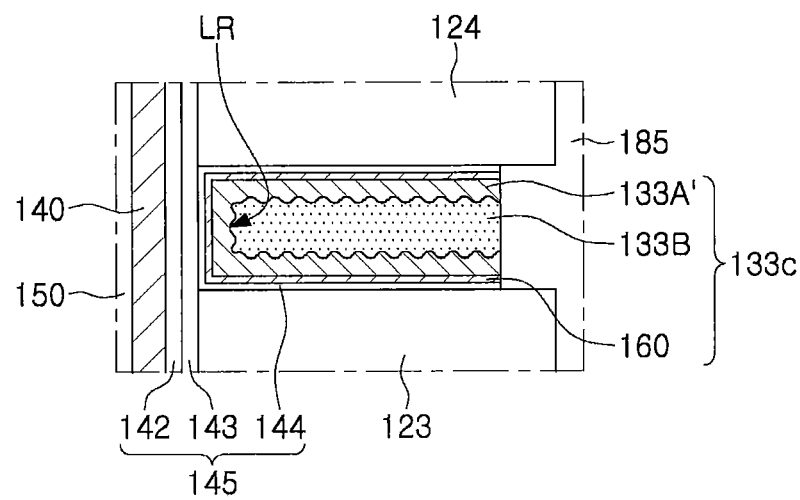

FIGS. 5 to 7 are enlarged views of the area A of FIG. 4 according to example embodiments of the present inventive concept.

Referring to FIG. 5, an area including a gate electrode 133a, gate dielectric layer 145, and channel region 140 of a memory cell string is illustrated.

The gate electrode 133a may include first and second conductive layers 133A and 133B and a barrier layer 160. Hereinafter, the first and second conductive layers 133A and 133B may be understood as being the same as the first and second conductive layers 130A and 130B described above with reference to FIGS. 3 and 4.

The first conductive layer 133A may have a first thickness T1 on surfaces of interlayer insulating layers 123 and 124. The first thickness T1 may be, for example, in a range of about 3 nm to about 15 nm. The second conductive layer 133B may have a second thickness T2 in a laterally recessed portion LR. The second thickness T2 may be, for example, in a range of about 15 nm to about 35 nm. The first conductive layer 133A may have a third thickness T3 at a portion extending on the channel region 140. The third thickness T3 may be the same as the first thickness T1, or smaller than the first thickness T1. In FIG. 5, although the first and second conductive layers 133A and 133B are illustrated as respectively having uniformly the first and second thicknesses T1 and T2, the present inventive concept is not limited thereto. For example, the thickness of the first conductive layer 133A may gradually increase or decrease toward the source insulating layer 185 from near the channel region 140, and thus the thickness of the second conductive layer 133B may vary.

The barrier layer 160 may be disposed between the gate dielectric layer 145 and the first conductive layer 133A around the first conductive layer 133A. The barrier layer 160 may be a diffusion barrier layer which may reduce or possibly prevent diffusion of elements of the first and second conductive layers 133A and 133B. The barrier layer 160 may include, for example, at least one of tungsten nitride (WN), tantalum nitride (TaN), and titanium nitride (TiN). The barrier layer 160 may have a thickness of, for example, about 3 nm or less. A side surface of the barrier layer 160 may be coplanar with side surfaces of the first and second conductive layers 133A and 133B.

The gate dielectric layer 145 may include a tunneling layer 142, a charge storage layer 143, and a blocking layer 144 sequentially stacked on the channel region 140. The tunneling layer 142 and the charge storage layer 143, together with the channel region 140, may extend perpendicularly to the substrate 101. The blocking layer 144 may be disposed to surround the gate electrode 133a. In some example embodiments, the charge storage layer 143, together with the blocking layer 144, may also be disposed to surround the gate electrode 133a. In some embodiments, only a portion of the blocking layer 144 may be disposed to surround the gate electrode 133a. Relative thicknesses of the layers of the gate dielectric layer 145 are not be limited to those illustrated in the drawings and may be variously modified according to example embodiments of the present inventive concept. Although a side surface of the gate dielectric layer 145 is illustrated as being coplanar with the side surface of the gate electrode 133a, the present inventive concept is not limited thereto. For example, the side surface of the gate dielectric layer 145 may extend on side surfaces of the interlayer insulating layers 123 and 124.

Charges may pass through the tunneling layer 142 to reach the charge storage layer 143 by the Fowler-Nordheim (FN) tunneling mechanism. The tunneling layer 142 may include, for example, $SiO_2$, $Si_3N_4$, silicon oxynitride (SiON), or any combination thereof. The charge storage layer 143 may be a charge trapping layer, for example, including silicon nitride. The blocking layer 144 may include $SiO_2$, $Si_3N_4$, SiON, a high-k material, or any combination thereof. Here, the high-k material may refer to a dielectric material having a higher dielectric constant than $SiO_2$. The high-k material may include, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSixOy$), hafnium oxide ($HfO_2$), hafnium silicon oxide (HfSixOy), lanthanum oxide ($La_2O_3$), lanthanum aluminum oxide (LaAlxOy), lanthanum hafnium oxide (LaHfxOy), hafnium aluminum oxide (HfAlxOy), praseodymium oxide ($Pr_2O_3$), or any combination thereof. 2

Referring to FIG. 6, a gate electrode 133b may include a third conductive layer 133C in addition to the first and second conductive layers 133A and 133B and the barrier layer 160. The third conductive layer 133C may be interposed between the first and second conductive layers 133A and 133B, and the second conductive layer 133B may be disposed in the outermost position. The third conductive layer 133C may be substantially conformally formed on the laterally recessed portion LR of the first conductive layer 133A. Accordingly, the third conductive layer 133C may also define a laterally recessed portion like the first conductive layer 133A.

The third conductive layer 133C may be formed of a material having good gap-filling properties and may be formed by a different process or under different process conditions from the first and second conductive layers 133A and 133B. Relative thicknesses of the first to third conductive layers 133A, 133B, and 133C are not limited to those illustrated in FIG. 6 and may be variously modified, according to example embodiments of the present inventive concept.

The third conductive layer 133C may include a higher impurity concentration than the first conductive layer 133A, and a lower impurity concentration than the second conductive layer 133B. In some example embodiments, the impurity concentration may gradually increase and resistivity and stress may also gradually increase, outwardly from the first conductive layer 133A to the second conductive layer 133B.

Referring to FIG. 7, a gate electrode 133c may include first and second conductive layers 133A' and 133B' and a barrier layer 160. The first conductive layer 133A' may have relatively large surface roughness. Such relatively large surface roughness may be obtained according to a manufacturing process and process conditions of the manufacturing process of forming the first conductive layer 133A'. However, even in this case, a side surface of the first conductive layer 133A' may have a smaller surface roughness than an upper surface of the first conductive layer 133A'. The surface roughness of the side surface of the first conductive layer 133A' may be the same as or similar to that of a side surface of the second conductive layer 133B. This may be because the side surface of the first conductive layer 133A' and the side surface of the second conductive layer 133B are simultaneously formed in an etching process during the manufacturing process.

FIGS. 8A to 8H illustrate a method of manufacturing a semiconductor device according to example embodiments of the present inventive concept. In FIGS. 8A to 8H, a region corresponding to a region shown in FIG. 4 may be illustrated.

Figure 9A:
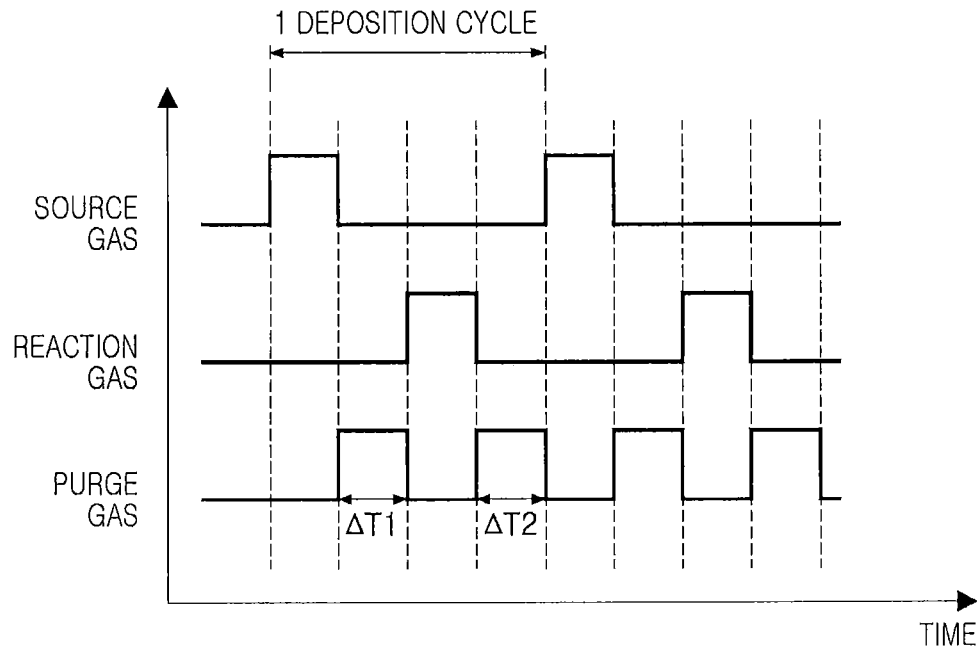
FIGS. 9A and 9B are graphs illustrating gas flow rates during deposition processes according to example embodiments of the present inventive concept.
Figure 9B:
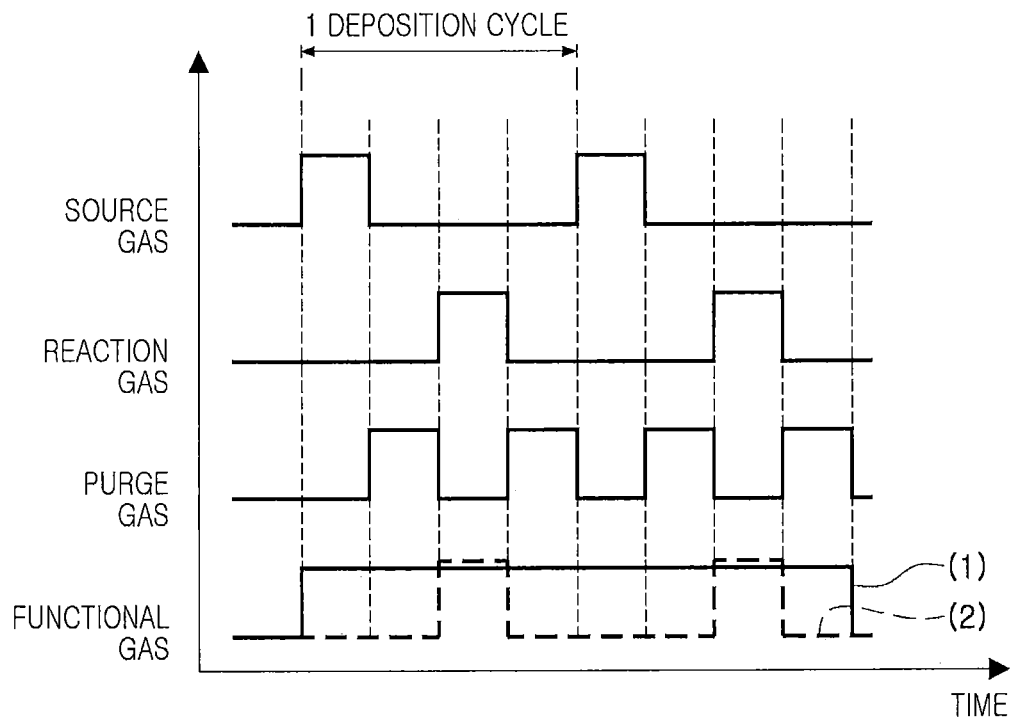

FIGS. 9A and 9B are graphs illustrating gas flow rates during deposition processes, which are provided to explain a method of manufacturing a semiconductor device according to example embodiments of the present inventive concept.

Figure 8A:
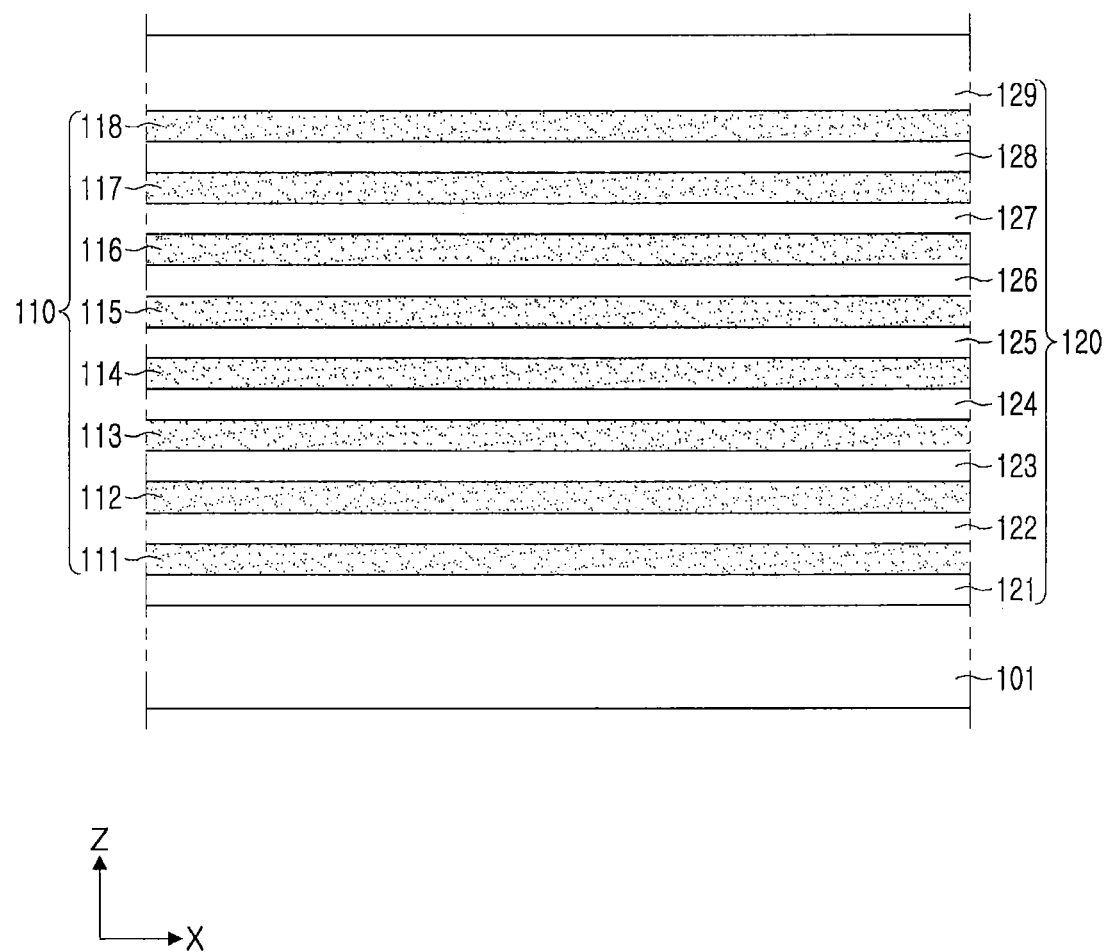
FIGS. 8A to 8H illustrate a method of manufacturing a semiconductor device according to example embodiments of the present inventive concept.

Referring to FIG. 8A, sacrificial layers 110 including 111 to 118 (i.e., 111, 112, 113, 114, 115, 116, 117, and 118) and interlayer insulating layers 120 may be alternately stacked on a substrate 101.

The sacrificial layers 110 may be layers that are substituted by gate electrodes 130 in a subsequent process. The sacrificial layers 110 may be formed of a different material from the interlayer insulating layers 120. For example, the interlayer insulating layers 120 may be formed of at least one of silicon oxide and silicon nitride, and the sacrificial layers 110 may be formed of a different material from the interlayer insulating layers 120, selected among silicon, silicon oxide, silicon carbide, and silicon nitride. In some example embodiments, thicknesses of the interlayer insulating layers 120 may not be the same. For example, the lowermost interlayer insulating layer 121 may be relatively thin, and the uppermost interlayer insulating layer 129 may be relatively thick. Thicknesses of the interlayer insulating layers 120 and the sacrificial layers 110 and the number of layers included in the interlayer insulating layers 120 and the sacrificial layers 110 may be variously modified from those illustrated in FIG. 8A.

Figure 8B:
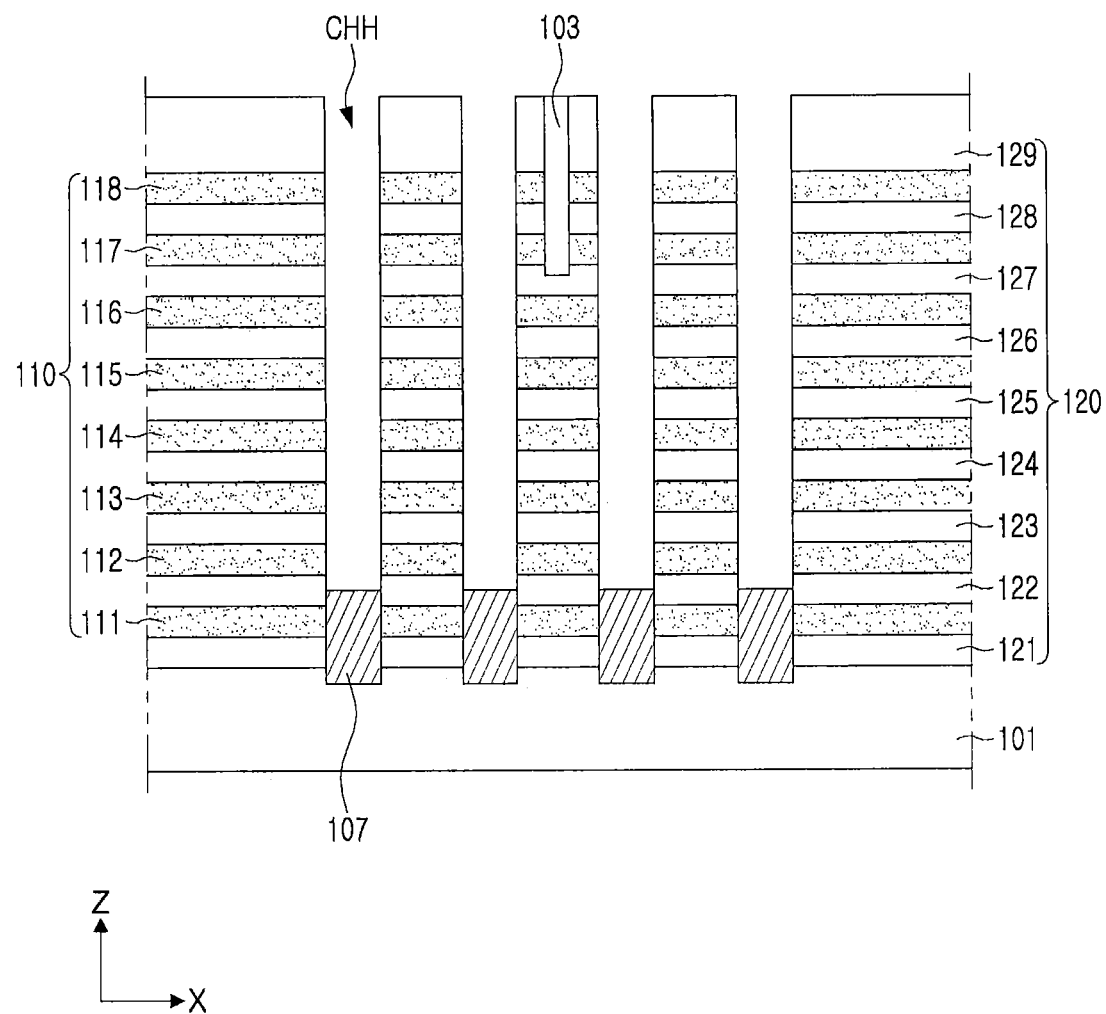

Referring to FIG. 8B, the process may include forming a string insulating layer 103, forming channel holes CHH extending perpendicular to the substrate 101, and forming epitaxial layers 107 at lower portions of the channel holes CHH.

The string insulating layer 103 may be formed by removing a predetermined number of sacrificial layers 110 and interlayer insulating layers 120, starting from the uppermost layer, using an additional mask layer. The string insulating layer 103 may be formed by depositing an insulating material on a region in which the sacrificial layers 110 and the interlayer insulating layers 120 are removed. The string insulating layer 103, like the interlayer insulating layers 120, may be formed of a material having an etch selectivity with respect to the sacrificial layers 110. For example, the string insulating layer 103 may be formed of the same material as the interlayer insulating layers 120.

The channel holes CHH may be formed in the form of holes by anisotropically etching a stacked structure of the sacrificial layers 110 and the interlayer insulating layers 120. Due to a height of the stacked structure, sidewalls of the channel holes CHH may not be exactly perpendicular to an upper surface of the substrate 101. The channel holes CHH may be formed to remove a portion of the substrate 101. Next, the epitaxial layers 107 may be formed in the channel holes CHH. The epitaxial layers 107 may be formed by, for example, a selective epitaxial growth (SEG) process. The epitaxial layers 107 may be formed in a single layer or in a plurality of layers. The epitaxial layers 107 may include doped or undoped polysilicon, single crystalline silicon, poly crystalline germanium, or single crystalline germanium.

Figure 8C:
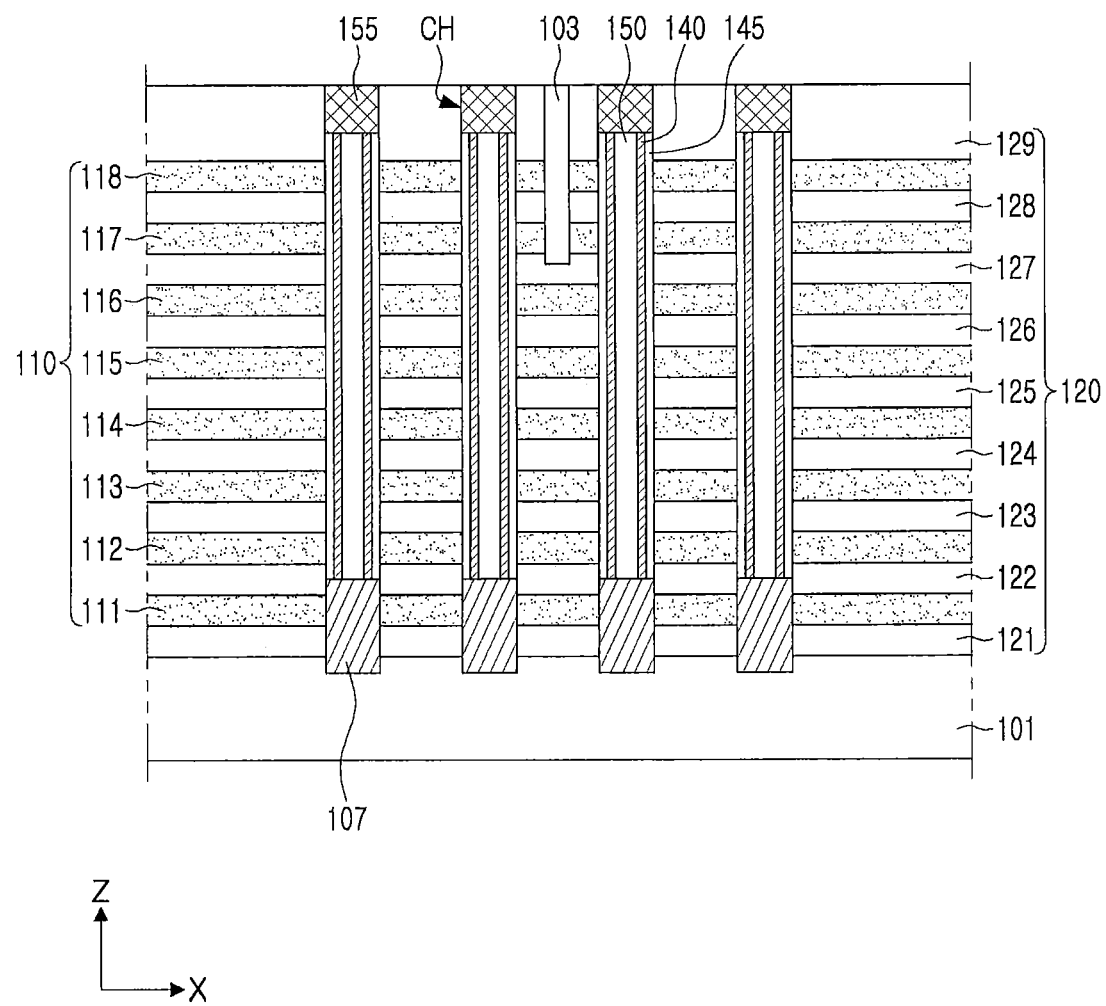

Referring to FIG. 8C, channels CH may be formed by forming gate dielectric layers 145, channel regions 140, channel insulating layers 150, and channel pads 155 in the channel holes CHH.

The gate dielectric layers 145 may be formed to have a uniform thickness by an atomic layer deposition (ALD) or chemical vapor deposition (CVD) method. In this process, the gate dielectric layers 145 may be fully or partially formed, that is, portions extending perpendicularly to the substrate 101 in the channel holes CHH may be formed. For example, the tunneling layers 142 and the charge storage layers 143 in FIG. 5 may be formed in this process.

The channel regions 140 may be formed on the gate dielectric layers 145 in the channel holes CHH. The channel insulating layers 150 may be formed of an insulating material to fill the channel holes CHH. However, in some example embodiments, the channel regions 140 may be filled with a conductive material instead of the channel insulating layers 150. The channel pads 155 may be formed of a conductive material, such as polysilicon.

Figure 8D:
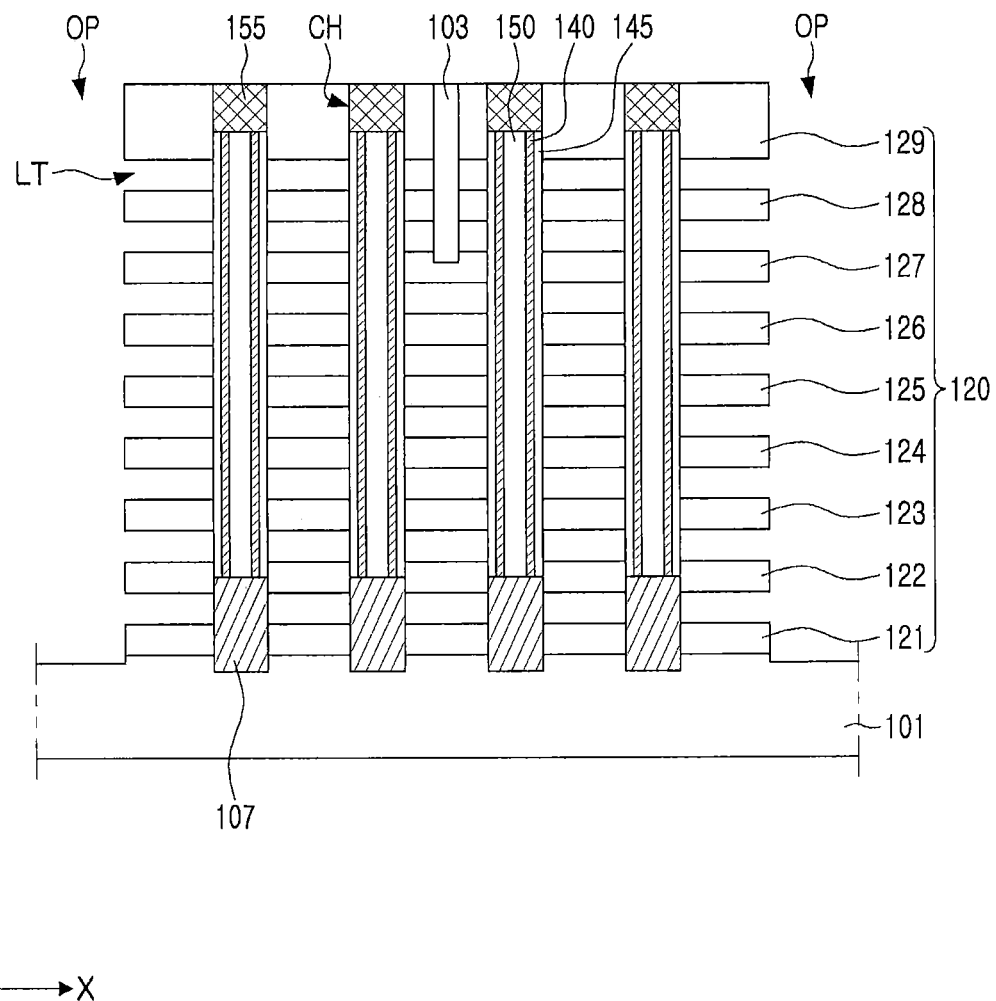

Referring to FIG. 8D, isolation areas OP may be formed to separate the stacked structure of the sacrificial layers 110 and the interlayer insulating layers 120 at predetermined intervals. Then, lateral openings LT may be formed by removing the sacrificial layers 110 exposed by the isolation areas OP.

In some example embodiments, before the isolation areas OP are formed, an insulating layer may be additionally formed on the uppermost interlayer insulating layer 129 and the channel pads 155 thereby reducing or possibly preventing damage of the channel pads 155 and the channel regions 140 disposed below the channel pads 155. The isolation areas OP may be formed by forming a mask layer using a photolithography process and anisotropically etching the stacked structure of the sacrificial layers 110 and the interlayer insulating layers 120. The isolation areas OP may be formed in regions in which the source conductive layer 180 and the source insulating layer 185 illustrated in FIG. 3 are arranged, in the form of trenches extending in the Y-direction.

The sacrificial layers 110 may be removed selectively with respect to the interlayer insulating layers 120 using, for example a wet etching process. Accordingly, the plurality of lateral openings LT may be formed between the interlayer insulating layers 120. Through the lateral openings LT, portions of the gate dielectric layers 145 in the channels CH, for example, sidewalls of the charge storage layers 143 or blocking layers 144 may be exposed.

Figure 8E:
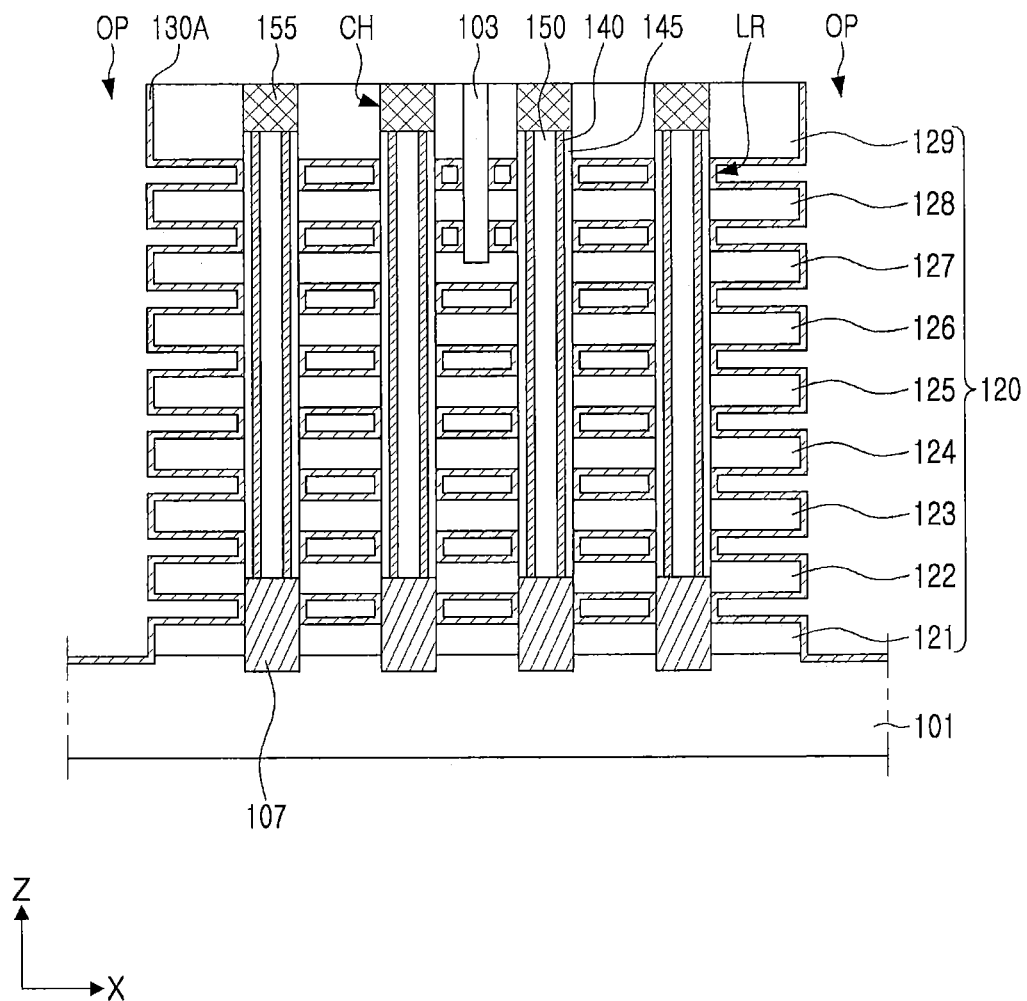

Referring to FIGS. 8E and 9A, a first conductive layer 130A of the gate electrodes 130 may be formed in the lateral openings LT.

In some embodiments, before the first conductive layer 130A is formed, a barrier layer 160 illustrated in FIGS. 5 to 7 may be formed. The first conductive layer 130A may be formed on sidewalls of the channels CH and the interlayer insulating layers 120 in the lateral openings LT. The first conductive layer 130A may define laterally recessed portions LR concavely recessed toward the channels CH.

The first conductive layer 130A may be formed by, for example, an ALD process. In this case, as illustrated in FIG. 9A, gases for depositing the first conductive layer 130A may be injected (e.g., supplied). The process may include a step of supplying a source gas, a step of supplying a reaction gas, and steps of injecting a purge gas after each step of supplying gases. Given the steps as one deposition cycle, the deposition cycle may be repeatedly performed.

The source gas may include a precursor containing a material forming the first conductive layer 130A. The precursor may be supplied in a gaseous state, or using an inert gas as a carrier gas. The precursor may be supplied with an inert gas, which is used as a carrier gas. The reaction gas may serve nucleation of the precursor and may be a gas oxidizing or reducing the precursor. The purge gas may include Ar, He, or $N_2$, and may function to remove a residual byproduct, and the source gas and reaction gas that are not adsorbed. In some embodiments, the purge gas may remove residual source gas and residual reaction gas after forming a thin layer. For example, when the first conductive layer 130A is formed of W, the source gas may be at least one of $WF_6$, $WCl_6$, $WCl_5$, $W(CO)_6$, $W(C_6H_6)_2$, $W(PF_3)_6$, $W(allyl)_4$, (1, 5-COD)$W(CO)_4$, and $(C_5H_5)_2WH_2$. The reaction gas may be at least one of $B_2H_6$, $SiH_4$, and $H_2$. In some embodiments, the source gas for the first conductive layer 130A may include $WF_6$, $WCl_6$, $WCl_5$, $W(CO)_6$, $W(C_6H_6)_2$, $W(PF_3)_6$, $W(allyl)_4$, (1, 5-COD)$W(CO)_4$, and/or $(C_5H_5)_2WH_2$, and the reaction gas may include $B_2H_6$, $SiH_4$, and/or $H_2$.

A temperature of the process (e.g., ambient temperature) may be, for example, from about 150° C. to about 450° C., and a pressure of the process may be, for example, from about 1 Torr to about 90 Torr. The temperature and pressure of the process may vary depending on the material of the source gas. When the process temperature is higher or lower than the given range of temperature, the atomic layer deposition (that is, self-limiting growth) may not occur. When the process pressure is lower than the given range of pressure, reaction between the source gas and the reaction gas may not sufficiently occur.

The first conductive layer 130A may be formed to contain a lower concentration of impurities (e.g., F, Cl and C) than the second conductive layer 130B. In this regard, the first conductive layer 130A may be formed in a lower process pressure and a higher process temperature than the second conductive layer 130B. Accordingly, the impurities may be smoothly discharged while the first conductive layer 130A is formed. Simultaneously with or separately from the control of pressure and temperature of the process, purging performed using the purge gas may enhance formation of the first conductive layer 130A. Supplying time and/or supplying amount of the purge gas may be relatively increased. For example, at least one of the supplying times $\Delta T1$ and $\Delta T2$ of the purge gas illustrated in FIG. 9A may be longer than that for forming the second conductive layer 130B. In addition, the supplying time $\Delta T1$ of the purge gas after supplying the source gas may be longer than the supplying time ΔT2 of the purge gas after supplying the reaction gas, but the present inventive concept is not limited thereto.

Due to the process, the first conductive layer 130A may not include impurities, such as F, Cl, or C, or may include them at a relatively low concentration.

Figure 8F:
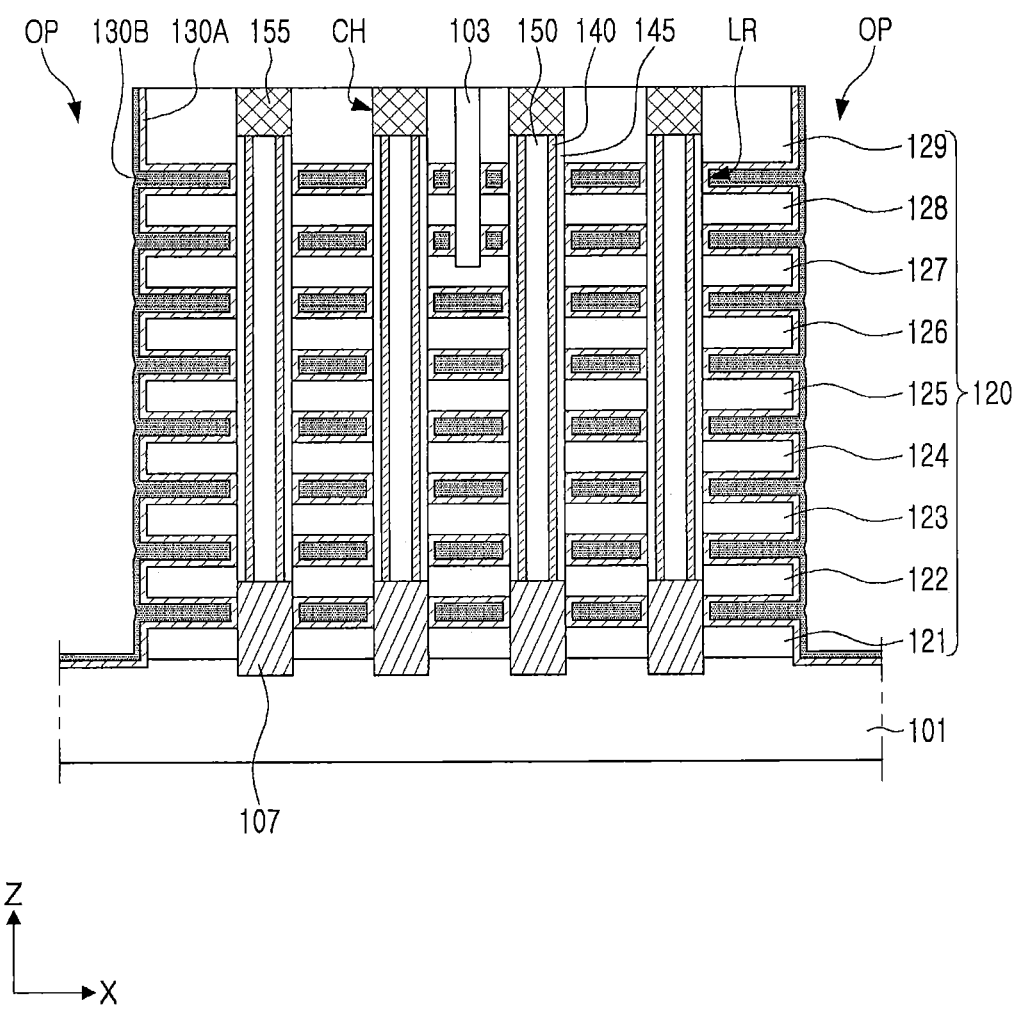

Referring to FIGS. 8F and 9B, the gate electrodes 130 may be formed in the lateral openings LT by forming the second conductive layer 130B filling the laterally recessed portions LR of the first conductive layer 130A.

The second conductive layer 130B may fill the lateral openings LT and have a substantially uniform thickness in the isolation areas OP. In some example embodiments, the second conductive layer 130B may have a smaller surface roughness than the first conductive layer 130A.

The second conductive layer 130B may be formed by, for example, an ALD process or a CVD process. When the second conductive layer 130B is formed by the ALD process, gases for depositing the second conductive layer 130B may be injected in a sequence illustrated in FIG. 9B. The process may be similar to the process of forming the first conductive layer 130A described above with reference to FIG. 9A. However, as illustrated in FIG. 9B, a functional gas may be additionally supplied during the formation of the second conductive layer 130B. The functional gas may be supplied to inject (e.g., add) additional impurities into the second conductive layer 130B. The functional gas may be continuously supplied during the process (Flow (1) of the functional gas in FIG. 9B) or may be supplied while supplying the reaction gas (Flow (2) of the functional gas in FIG. 9B). However, the present inventive concept is not limited thereto. The flow rate of the supplied gas may be variously modified according to example embodiments of the present inventive concept. In FIG. 9B, a difference in height between Flow (1) and Flow (2) of the functional gas is provided just for distinction, and is not intended to show the difference in flow rate. The functional gas may be, for example, $N_2$. By supplying additional impurities using the functional gas, the second conductive layer 130B may include a high concentration of impurities while the process temperature increases, compared to the case in which the functional gas is not used.

The second conductive layer 130B may include the relatively high concentration of impurities compared to the first conductive layer 130A. In this regard, the second conductive layer 130B may be formed under a relatively high process pressure and at a relatively low process temperature compared to the first conductive layer 130A. In some embodiments, the second conductive layer 130B may be formed by simultaneously injecting the source gas and the reaction gas, using a CVD process.

In the process, the second conductive layer 130B may include impurities containing N supplied by the functional gas and at least one of F, Cl, and C supplied by the source gas at a relatively high concentration.

In some example embodiments, the gate electrodes 130 may include three or more conductive layers, as described in the example embodiment illustrated in FIG. 6. In this case, since a conductive layer formed between the first and second conductive layers 130A and 130B has a relatively small thickness, the conductive layer may have good gap-filling capability and good step coverage. In this regard, the conductive layer may be controlled to be deposited at a low deposition rate than the first conductive layer 130A. For example, the process temperature and pressure during the formation of the conductive layer may be lower than the process temperature and pressure during the formation of the first conductive layer 130A. In addition, the gas flow rate may be controlled to be relatively low. In the example embodiment in which the gate electrodes 130 include two conductive layers, even when spaces of the laterally recessed portion LR in which the second conductive layer 130B is to be formed are relatively narrow, the second conductive layer 130B may be formed under similar process conditions to those of the conductive layer.

Figure 8G:
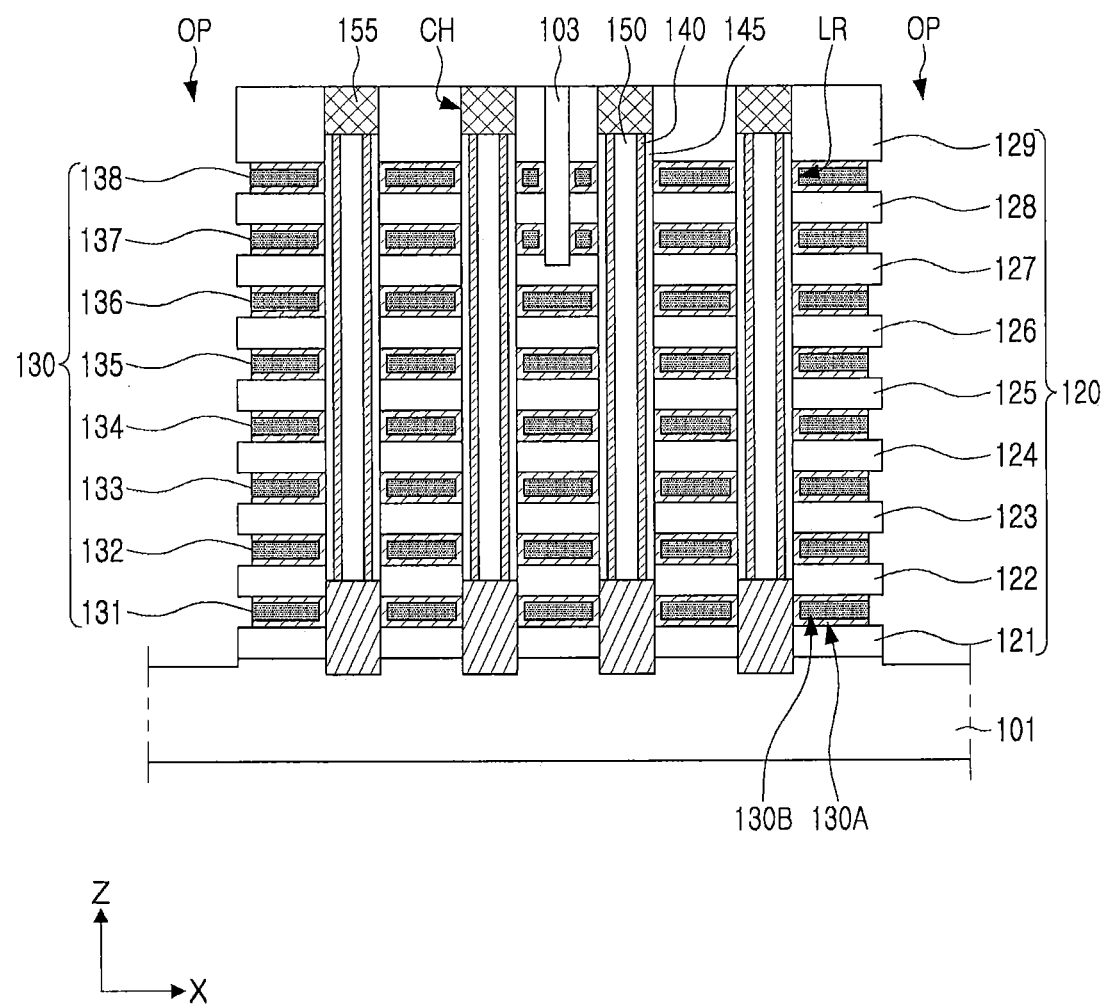

Referring to FIG. 8G, the material formed on the sidewalls of the interlayer insulating layers 120 and the substrate 101 in the isolation areas OP to form the gate electrodes 130 may be removed.

The material formed in the isolation areas OP form the gate electrodes 130 may be removed by an etching process such that the gate electrodes 130 are only disposed in the lateral openings LT (refer to FIG. 8D). The etching process may be, for example, a wet etching process, and accordingly, side surfaces of the gate electrodes 130 may be defined. In order to secure electrical isolation between vertically adjacent gate electrodes 130, the side surfaces of the gate electrodes 130 may be inwardly recessed toward the channels CH relative to side surfaces of the interlayer insulating layers 120.

Since the second conductive layer 130B having relatively good morphology is formed in the outermost position of the gate electrodes 130, the gate electrodes 130 may be uniformly etched in the X-direction during the etching process. Accordingly, the final structure of the gate electrodes 130 may have even side surfaces.

In some example embodiments, an annealing process may be additionally performed on the gate electrodes 130. Through the annealing process, portions of the impurities may be removed in order not to form the gate electrodes 130 including excessive impurities.

Figure 8H:
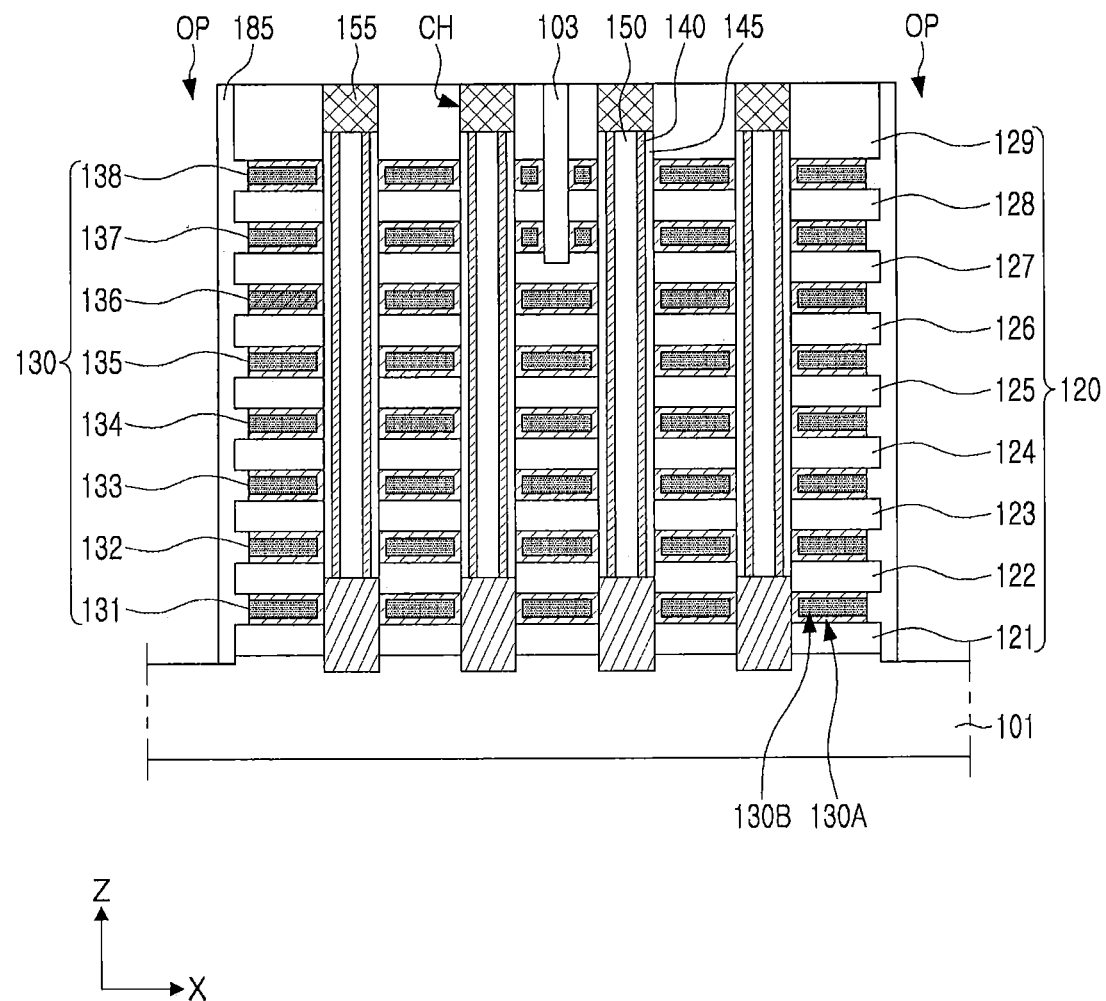

Referring to FIG. 8H, a source insulating layer 185 may be formed in the isolation areas OP.

The source insulating layer 185 may be formed in the form of a spacer by forming an insulating material and removing the insulating material from the substrate 101 until the upper surface of the substrate 101 is exposed.

Referring back to FIG. 4, a source conductive layer 180 may be formed by depositing a conductive material on the source insulating layer 185. Next, interconnection structures, such as contact plugs and bit lines, may further be formed on the channel pads 155.

Figure 10:
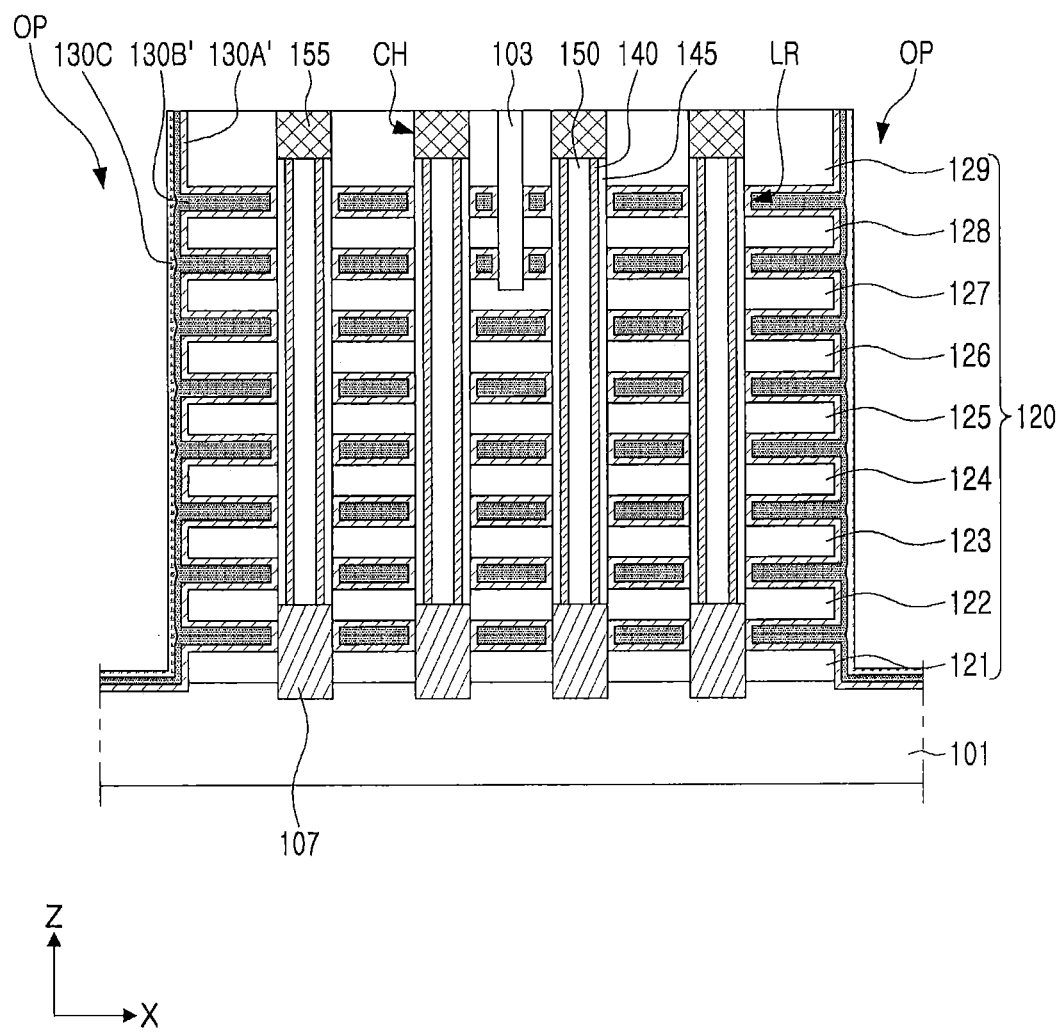
FIG. 10 is a cross-sectional view illustrating a process step of a method of manufacturing a semiconductor device according to example embodiments of the present inventive concept.

FIG. 10 is a cross-sectional view illustrating a process step of a method of manufacturing a semiconductor device according to example embodiments of the present inventive concept.

Referring to FIG. 10, the process described above with reference to FIGS. 8A to 8F may be performed.

Next, as illustrated in FIG. 10, a third conductive layer 130C may further be formed on first and second conductive layers 130A' and 130B' in the isolation areas OP. The third conductive layer 130C may be formed to cap the first and second conductive layers 130A' and 130B'. The third conductive layer 130C may be formed to have superior morphology to the second conductive layer 130W. The third conductive layer 130C may include a higher concentration of impurities than the first and second conductive layers 130A' and 130B'. That is, concentrations of impurities in the first to third conductive layers 130A', 130B', and 130C may sequentially increase, but are not limited thereto. The third conductive layer 130C may be formed under a higher process pressure and/or at a lower process temperature than the first and second conductive layers 130A' and 130B' in an ALD or CVD process.

Next, the process described above with reference to FIGS. 8G and 8H may be performed. In particular, in the process described above with reference to FIG. 8G, the material forming the gate electrodes 130 may be uniformly etched due to the third conductive layer 130C having a small surface roughness. Since the third conductive layer 130C is fully removed during the etching process, it may not remain. In some embodiments, the third conductive layer 130C may be completely removed during the process illustrated in FIG. 8G.

Figure 11:
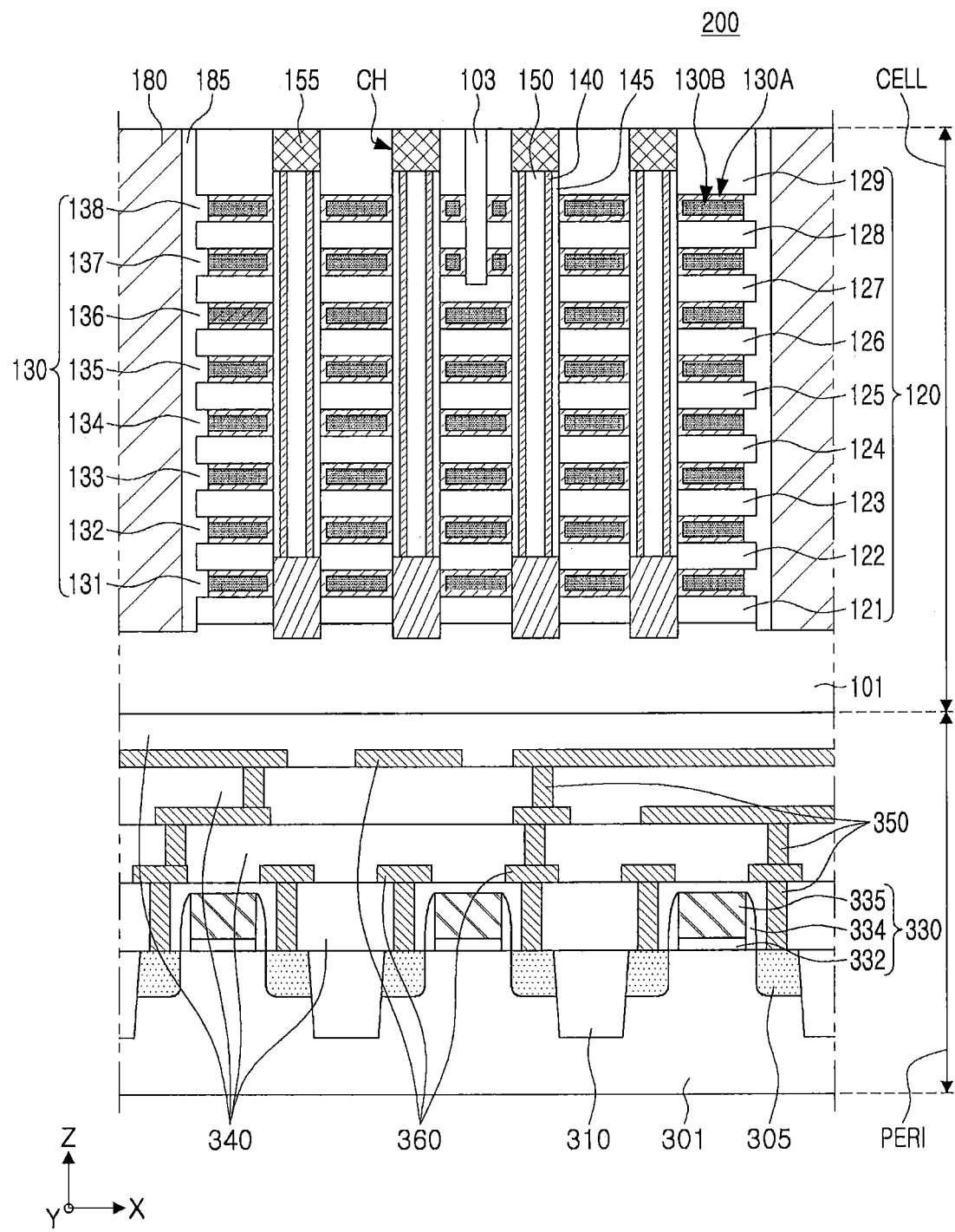
FIG. 11 is a cross-sectional view of a semiconductor device according to example embodiments of the present inventive concept.

FIG. 11 is a schematic cross-sectional view of a semiconductor device according to example embodiments of the present inventive concept.

Referring to FIG. 11, a semiconductor device 200 may include a memory cell region CELL and a peripheral circuit region PERI. The memory cell region CELL may be disposed on the peripheral circuit region PERI. In some example embodiments, the memory cell region CELL may be disposed below the peripheral circuit region PERI.

The memory cell region CELL, as described above with reference to FIGS. 3 and 4, may include a substrate 101, channels CH extending in a direction perpendicular to an upper surface of the substrate 101 (i.e., Z-direction) and having channel regions 140 thereinside, a plurality of interlayer insulating layers 120 stacked on outer sidewalls of the channels CH, and a plurality of gate electrodes 130 including at least two conductive layers 130A and 130B. The memory cell region CELL according to the example embodiment illustrated in FIG. 11 may have a structure the same as or similar to that discussed above with reference to FIG. 4. However, the present inventive concept is not limited thereto, and the memory cell region CELL may have various structures according to various example embodiments described herein.

The peripheral circuit region PERI may include a base substrate 301, circuit devices 330 arranged on the base substrate 301, contact plugs 350, and interconnection lines 360.

The base substrate 301 may include an upper surface extending in horizontal directions (e.g., the X-direction and the Y-direction). The base substrate 301 may include device isolation regions 310 defining active regions. Source/drain areas 305 including impurities may be arranged in portions of the active regions. The base substrate 301 may include a semiconductor material, such as a Group IV semiconductor material, a Group compound semiconductor material, or a Group II-VI oxide semiconductor material.

The circuit devices 330 may include planar transistors. Each of the circuit devices 330 may include a circuit gate insulating layer 332, a spacer layer 334, and a circuit gate electrode 335. The source/drain areas 305 may be arranged at both sides of the circuit gate electrode 335 in the base substrate 301. The source/drain areas 305 may function as source areas or drain areas of the circuit devices 330.

A plurality of peripheral insulating layers 340 may be arranged on the circuit devices 330 arranged on the base substrate 301. The contact plugs 350 may pass through the peripheral insulating layers 340 to be connected to the source/drain areas 305. Through the contact plugs 350, an electrical signal may be applied to the circuit devices 330. In some embodiments, some of the contact plugs 350 may be connected to the circuit gate electrode 335. The interconnection lines 360 may be connected to the contact plugs 350 and formed in a plurality of layers.

The semiconductor device 200 may be manufactured by forming the peripheral circuit region PERI, then forming the substrate 101 of the memory cell region CELL on the peripheral circuit region PERI, and then forming the memory cell region CELL. The substrate 101 may have the same size as the base substrate 301, or a smaller size than the base substrate 301. The memory cell region CELL and the peripheral circuit region PERI may be connected to each other in a region not illustrated in the drawings. For example, an end of the gate electrode 130 in the X-direction may be electrically connected to the circuit device 330.

As set forth above, according to the example embodiments of the present inventive concept, a semiconductor device having improved reliability can be obtained by forming gate electrodes including a plurality of conductive layers having different characteristics (e.g., properties).

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
   a plurality of gate electrodes stacked on a substrate and spaced apart from each other in a vertical direction; and
   a channel region extending through the plurality of gate electrodes in the vertical direction,
   wherein each of the plurality of gate electrodes includes a first conductive layer defining a recess recessed toward the channel region, and a second conductive layer in the recess defined by the first conductive layer, and the first conductive layer is between the channel region and the second conductive layer,
   wherein a first concentration of impurities in the second conductive layer is higher than a second concentration of the impurities in the first conductive layer, and the impurities include nitrogen (N),
   wherein the impurities further include at least one of fluorine (F), chlorine (Cl), and carbon (C), and a nitrogen concentration in the second conductive layer is lower than a concentration of fluorine, chlorine, and carbon in the second conductive layer.

2. The semiconductor device of claim 1, wherein the second concentration of the impurities in the first conductive layer is less than 5% of the first concentration of the impurities in the second conductive layer.

3. The semiconductor device of claim 1, wherein the first conductive layer has a lower resistivity than the second conductive layer.

4. The semiconductor device of claim 1, wherein an average grain size of the first conductive layer is smaller than an average grain size of the second conductive layer.

5. The semiconductor device of claim 1, further comprising:
   a plurality of interlayer insulating layers stacked alternately with the plurality of gate electrodes on the substrate; and
   a gate dielectric layer between the channel region and the plurality of gate electrodes,
   wherein the first conductive layer is between a pair of the plurality of interlayer insulating layers that are vertically adjacent to each other and extends on a lower surface of an upper one of the pair of the plurality of interlayer insulating layers, a side of the gate dielectric layer, and an upper surface of a lower one of the pair of the plurality of interlayer insulating layers.

6. The semiconductor device of claim 1, further comprising at least one intermediate conductive layer between the first conductive layer and the second conductive layer.

7. The semiconductor device of claim 6, wherein the first concentration of the impurities in the second conductive layer is higher than a third concentration of the impurities in the at least one intermediate conductive layer.

8. The semiconductor device of claim 7, wherein the third concentration of the impurities in the at least one intermediate conductive layer is higher than the second concentration of the impurities in the first conductive layer.

9. The semiconductor device of claim 1, wherein the first concentration of the impurities in the second conductive layer is in a range of from about $5\times10^{19}/cm^3$ to about $5\times10^{21}/cm^3$.

10. The semiconductor device of claim 1, wherein the first conductive layer and the second conductive layer comprise a same metallic material.

11. The semiconductor device of claim 10, wherein the first conductive layer and the second conductive layer comprise tungsten (W).

12. A semiconductor device comprising: a plurality of gate electrodes stacked on a substrate and spaced apart from each other in a vertical direction; and a channel region extending through the plurality of gate electrodes in the vertical direction, wherein each of the plurality of gate electrodes includes a first conductive layer defining a recess recessed toward the channel region, and a second conductive layer in the recess defined by the first conductive layer, and the first conductive layer is between the channel region and the second conductive layer, wherein the second conductive layer has a first concentration of impurities higher than a second concentration of the impurities in the first conductive layer and has a first resistivity higher than a second resistivity of the first conductive layer, wherein a first nitrogen concentration in the first conductive layer is lower than a second nitrogen concentration in the second conductive layer, and wherein the first concentration of the impurities in the second conductive layer is in a range of from about 5×1019/cm3 to about 5×1021/cm3, wherein the impurities include at least one of fluorine (F), chlorine (Cl), carbon (C), or nitrogen (N).

13. A semiconductor device comprising:
a plurality of gate electrodes stacked on a substrate and spaced apart from each other in a vertical direction; and
a channel region extending through the plurality of gate electrodes in the vertical direction,
wherein each of the plurality of gate electrodes includes a first metallic layer defining a recess recessed toward the channel region, and a second metallic layer in the recess defined by the first metallic layer, and the first metallic layer is between the channel region and the second metallic layer,
wherein a first nitrogen concentration in the second metallic layer is higher than a second nitrogen concentration in the first metallic layer, and
wherein the second metallic layer further include non-metallic elements including at least one of fluorine (F), chlorine (Cl), or carbon (C), and the first nitrogen concentration in the second metallic layer is lower than a first concentration of the non-metallic elements in the second metallic layer.

14. The semiconductor device of claim 13, wherein the first concentration of the non-metallic elements in the second metallic layer is higher than a second concentration of the non-metallic elements in the first metallic layer.

15. The semiconductor device of claim 1, wherein the first conductive layer comprises a first vertical side facing the channel region and a second vertical side opposite to the first vertical side, and
wherein the second conductive layer contacts the second vertical side of the first conductive layer.

* * * * *